United States Patent [19]

Darrow et al.

[11] Patent Number: 5,584,293
[45] Date of Patent: Dec. 17, 1996

[54] TIME-LINE IMAGING-PLANE PRESCRIPTION FOR MRI

[75] Inventors: Robert D. Darrow, Scotia; Christopher J. Hardy, Schenectady, both of N.Y.

[73] Assignee: General Electric Company, Schenectady, N.Y.

[21] Appl. No.: 515,786

[22] Filed: Aug. 16, 1995

[51] Int. Cl.$^6$ ................................................. A61B 5/05
[52] U.S. Cl. ................................. 128/653.2; 128/653.1; 128/653.3; 395/135; 324/309
[58] Field of Search ........................... 128/653.2, 653.3, 128/653.1; 395/100, 106, 135; 324/309

[56] References Cited

U.S. PATENT DOCUMENTS

| | | |
|---|---|---|
| 5,038,783 | 8/1991 | Dumoulin . |
| 5,365,927 | 11/1994 | Roemer et al. . |
| 5,512,826 | 4/1996 | Hardy et al. ........................ 324/309 |

Primary Examiner—Marvin M. Lateef
Assistant Examiner—Eleni Mantis Mercader
Attorney, Agent, or Firm—Lawrence P. Zale; Marvin Snyder

[57] ABSTRACT

Imaging parameters, such as the location, orientation and field of view of an imaging plane are selected. These parameters are provided to a pulse sequencer of a magnetic resonance (MR) scanner which modifies an MR pulse sequence to acquire an image at the selected imaging plane. The pulse sequencer controls an RF transmitter and gradient amplifiers to cause an MR image of the subject at an imaging plane to be acquired. The MR image is displayed on a display device. An interface device receives and reduces the MR image to an image icon and saves the image icon along with the corresponding imaging parameters. The image icons are displayed on the periphery of the screen around an MR image. An operator may then view and select one of the image icons, employing the pointing device. This causes the imaging parameters corresponding to the selected image icon to be sent to the pulse sequencer thereby causing an MR image to be acquired with these imaging parameters.

4 Claims, 4 Drawing Sheets

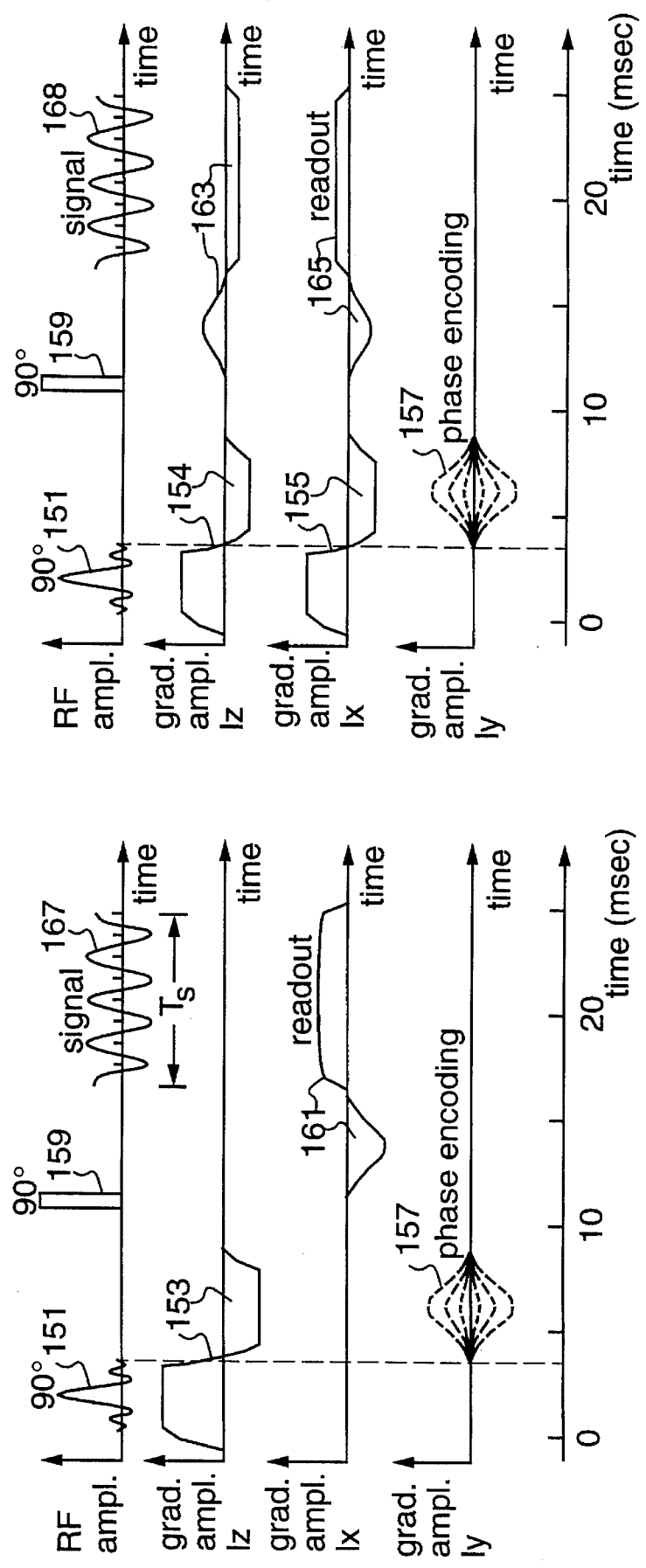

TIME-LINE IMAGING-PLANE PRESCRIPTION FOR MRI

CROSS REFERENCE TO RELATED APPLICATIONS

This application is related to U.S. patent applications "Screen-Based Interactive Image-Plane Prescription For MRI" by C. Hardy, R. Darrow Ser. No. 08/458,601, filed Jun. 2, 1995; "Scan Control Platform-Based Interactive Image Plane Prescription for MRI" Ser. No. 08/460,018, filed Jun. 2, 1995; "Oblique MR Image Controlled from a 3D Workstation Model" by Cline et al. Ser. No. 08/203,079 filed Feb. 28, 1994; all assigned to the present assignee, and all hereby incorporated by reference.

BACKGROUND OF THE INVENTION

1. Field of the Invention

The present application relates to a magnetic resonance (MR) imaging system, and more specifically to an MR imaging system which allows interactive selection of imaging planes during imaging.

2. Description of Related Art

In conventional magnetic resonance (MR) imaging systems, the three dimensional location of a desired region of the patient to be imaged must be provided to the MR imaging system before obtaining the image. In addition to the location, the three dimensional orientation, and field of view must also be provided. Together these define a set of 'imaging parameters'. These imaging parameters typically are calculated manually, or prescribed graphically, such as by drawing a line on a previously acquired image. Even though the computations may not be difficult, it becomes cumbersome to produce several images at different locations, orientations, and fields of view.

It is especially desirable to adjust the imaging plane interactively while searching through the subject for anatomy, such as the coronary arteries. With new open magnet MR Imaging systems, such that as described in U.S. Pat. No. 5,365,927 issued Nov. 22, 1994 "Magnetic Resonance Imaging System With Pointing Device" Roemer et al., assigned to the present Assignee, and hereby incorporated by reference; it is possible to perform medical procedures on a subject and simultaneously acquire a series of continuous MR images. When a medical procedure, such as surgery, is being performed, it is very desirable to minimize the time required to calculate the 'imaging parameters' to acquire images.

Also, while interactively adjusting the imaging plane, it is often desirable to be able to rapidly revisit a previously scanned imaging plane which is in a different location from the current imaging plane.

Currently there is a need for an MR imaging system which easily provides MR images with selected locations, orientations, and fields of view through internal structures of a subject.

SUMMARY OF THE INVENTION

A magnetic resonance (MR) imaging system provides interactive images of a patient undergoing a medical procedure.

An operator interactively selects imaging parameters, being location, orientation, and field of view for imaging by interacting with an interface device through a pointing device. The imaging parameters selected are sent to a pulse sequencer of an MR scanner.

The pulse sequencer device calculates geometric transformation parameters required to modify a predetermined MR pulse sequence to acquire an image of said subject through the imaging plane which corresponds to the imaging parameters. The modified MR pulse sequence is implemented in the MR scanner to result in an MR image of said subject at the desired imaging plane. This image is then displayed on a display device.

When a "store location" button is selected, the interface device creates an icon from the MR image by reducing the scale of the MR image and saving the image icon. The interface device also stores the imaging parameters corresponding to the MR image which was used to create the image icon. As new imaging parameters are selected, they may also be stored, along with the corresponding image icon.

The interface device continuously displays the current MR image on a screen along with image icons. An operator may select any of the image icons with the pointing device. This causes the interface device to pass the imaging parameters corresponding to the selected image icon to the pulse sequencer, to restore a previous imaging plane.

The pulse sequencer causes an MR image to be acquired with the imaging parameters corresponding to the selected image icon.

OBJECTS OF THE INVENTION

It is an object of the invention to provide a magnetic resonance (MR) imaging system which produces images of an imaging plane of the subject by selecting image icons on a screen.

Another object of the present invention is to select imaging parameters of past MR images, and create a new MR image with the selected imaging parameters quickly and easily.

Another object of the present invention is to allow a physician to visualize and select a location, orientation, and field of view of MR images from image icons of previously acquired images.

Another object of the present invention is to provide interactive MR images to a physician to aid the physician in locating and viewing selected structures within the heart.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 5 graphically illustrates an MR pulse sequence for exciting an imaging plane oriented orthogonal to the $I_z$ axis.

FIG. 6 graphically illustrates an MR pulse sequence to excite an imaging plane obliquely oriented with respect to the $I_x, I_z$ axes.

DETAILED DESCRIPTION OF THE INVENTION

Figure 1:
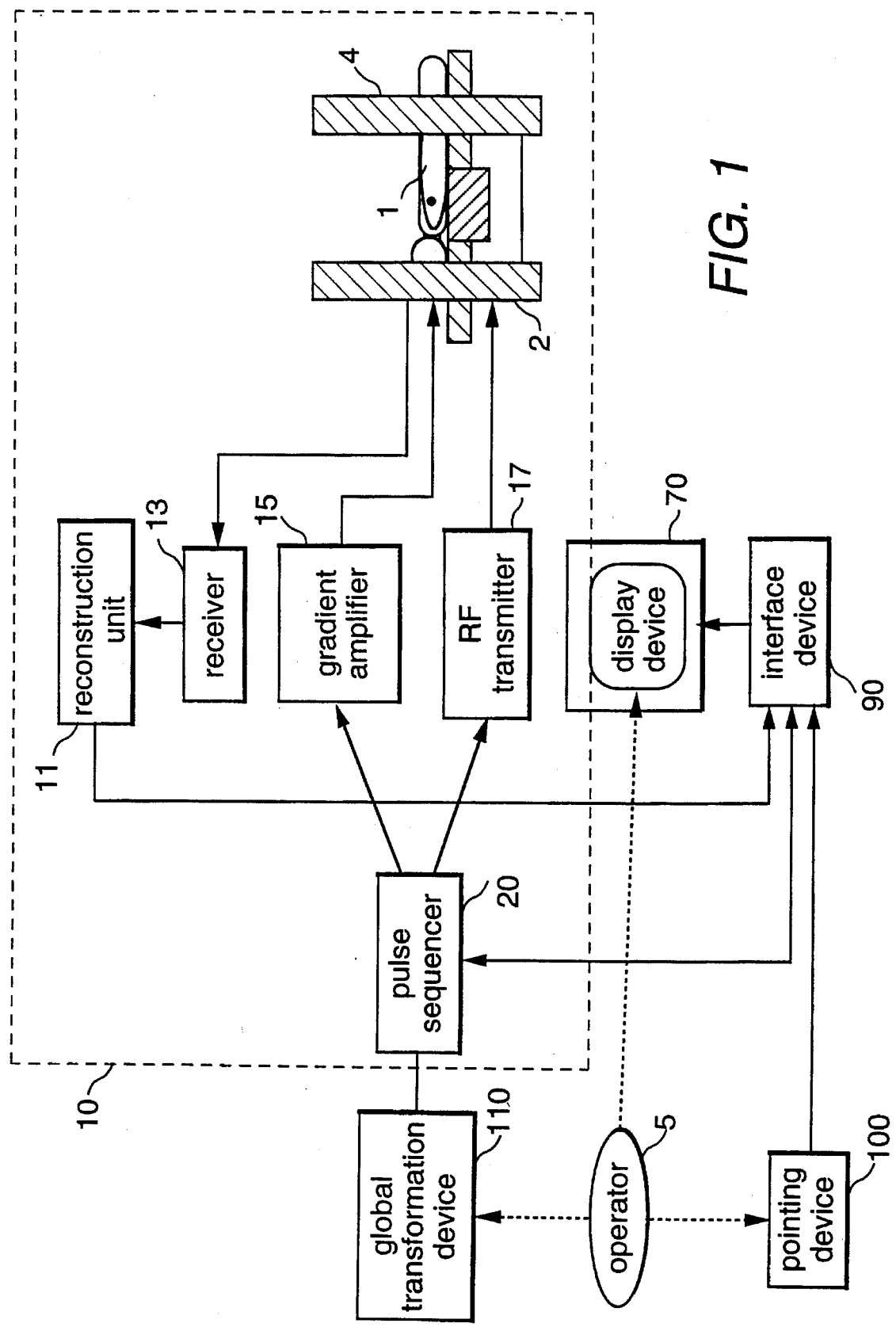
FIG. 1 is a block diagram of an embodiment of a magnetic resonance (MR) imaging system according to the present invention.

A block diagram of the magnetic resonance (MR) imaging system of the present invention is shown in FIG. 1. A subject 1 is positioned within a main magnet, shown here having two superconducting rings 2, 4 which provides a static, spatially homogeneous magnetic field over an imaging volume between the rings.

Gradient amplifiers 15 of a magnetic resonance (MR) scanner 10 provides power to a plurality of gradient coil sets located within rings 2, 4, each producing a magnetic field gradient in a specified direction. An RF transmitter 17, supplies the necessary power to RF coils to nutate nuclear spins within a patient in the imaging volume. The gradient coil sets within rings 2, 4 produce magnetic field gradients over the imaging volume without restricting access to the imaging volume, or the patient within the imaging volume.

An operator 5 interacts with interface device 90 through pointing device 100 to select a set of 'imaging parameters' being an imaging plane location, orientation, and field of view. Pointing device 100 may be a trackball but may also be other known 2D input devices such as a 'joystick' or a mouse.

The plane of subject 1 in which the image is acquired is known as the "imaging plane". Operator 5, through pointing device 100 and interface device 90, selects the imaging parameters by performing operations on a display device 70.

Interface device 90 receives an image from MR scanner 10 and displays the image on display device 70. Interface device 90 also allows operator 5 to select new locations and orientations of a proposed imaging plane, for example, by the method described in U.S. patent application "Screen-Based Interactive Image-Plane Prescription For MRI" by C. Hardy, R. Darrow (Atty. Docket No. RD-24,230) Ser. No. 08/458,601, filed Jun. 2, 1995.

Interface device 90, as described in connection with FIG. 3, reduces the MR image into a small image icon when directed by operator 5 through pointing device 100, and stores the image icon. Interface device 90 concurrently stores the imaging parameters corresponding to that image.

The image icons are displayed on the display device indicating views of the subject. Operator 5 may then select an image icon of a desired view.

The stored imaging parameters corresponding to the selected image icon are then provided to a pulse sequencer 20 which mixes x, y, and z components of a gradient pulse sequence to cause MR excitation of an imaging plane as defined by the imaging parameters.

Pulse sequencer 20 controls the timing and activation of gradient amplifiers 15 and RF transmitter 17 to produce magnetic field gradients and RF radiation which cause an MR response signal to be emitted by tissue of subject 1 in the imaging plane.

A receiver 13 receives the emitted MR response signal from the imaging plane of patient 1, and provides this signal to a reconstruction unit 11. Reconstruction unit 11 produces data for an MR image of patient 1 at the selected imaging plane. The image data is provided to interface device 90 and displayed on display device 70.

Figure 2:
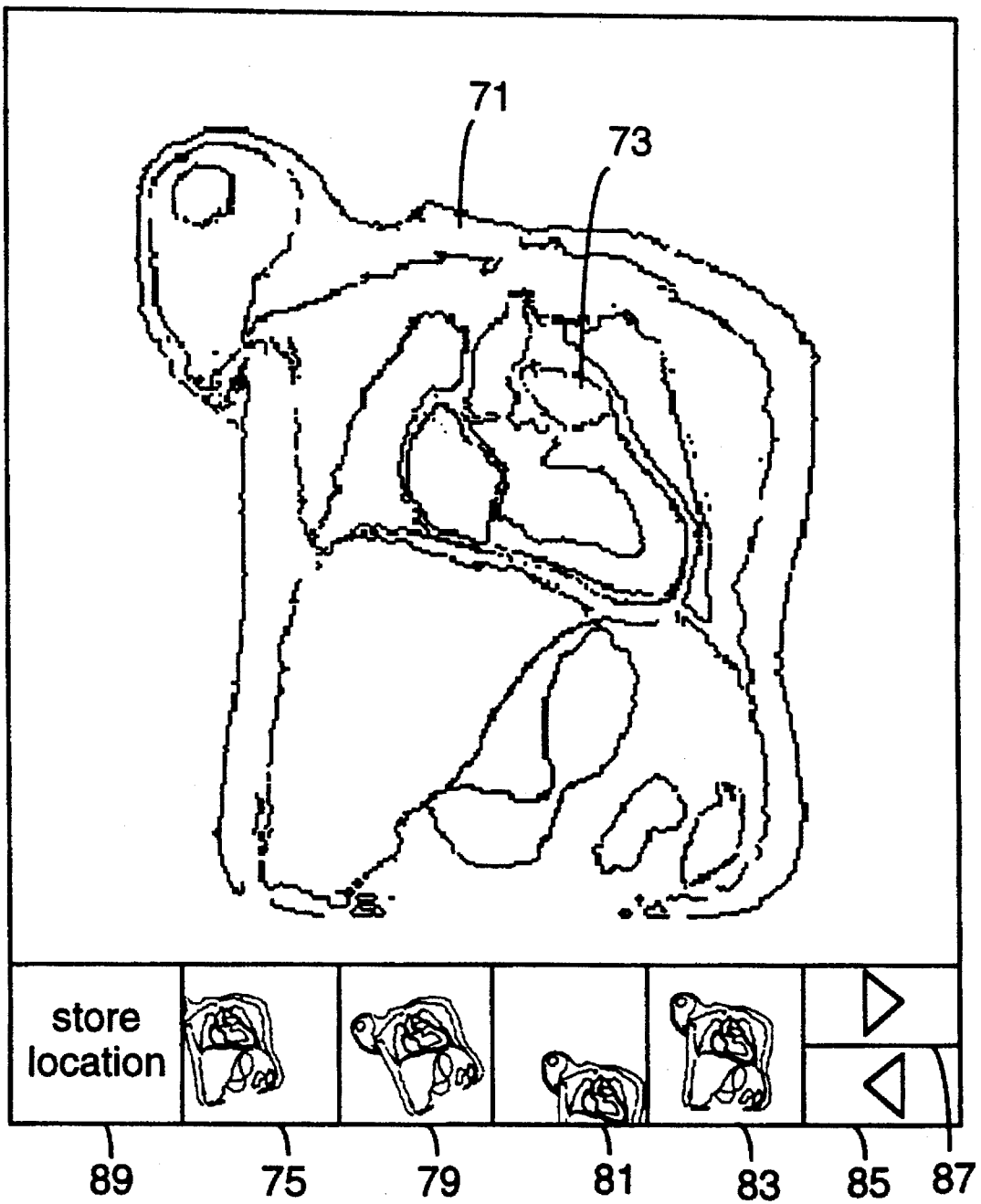
FIG. 2 is a diagram of an image of a subject's heart, with image icons displayed beneath the MR image.

FIG. 2 shows an image 71 of subject 1, which is displayed on display device 70, with subject's heart 73 in the center of the is image. Interface device 90 receives the MR image and reduces the image to an icon form and displays these image icons 75, 79, 81, 83 on display device 70. These may be in a scrolling format, as shown in FIG. 2 or otherwise arranged on the screen. Each image icon is stored, along with the imaging parameters corresponding to the MR image from which the icon was derived.

A screen button 89 is used to initiate creation and storage of the image icon and storage of the imaging parameters of the current MR image. Operator 5 selects screen buttons with the use of pointing device 100. When there are more image icons than can be displayed, in this case, displayed along the bottom of the screen, arrow icons 85 and 87 may be selected causing scrolling of the image icons to the left and right, respectively. If arrow icon 85 was selected, image icon 75 would move to the left and disappear whereas a new image icon would appear in the place of image icon 83. Image icons 79, 81, and 83 would also move to the left, and conversely when arrow icon 87 is selected, all image icons move the right with image icon 83 disappearing from view.

It can be seen from this that the image icon shows a small, scaled down view of the MR image which would be acquired if that icon is selected. The image icons are static images which were each derived from a previously acquired MR image, and do not show any differences or changes which occurred since the icon was created. However, the new MR image acquired when one of the image icons is selected shows the subject at the same location at the time the new image is acquired.

The use of image icons now allows operator 5 to select a new image acquired from the view indicated by the image icon.

Figure 3:
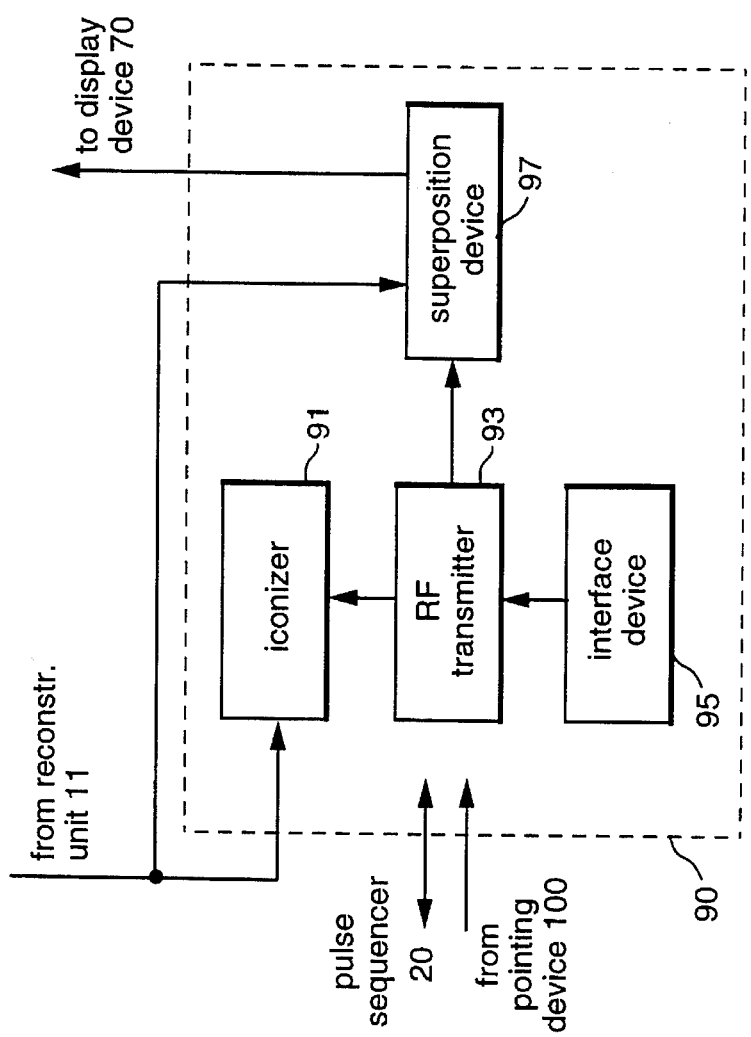
FIG. 3 is a more detailed block diagram of the interface device of FIG. 1.

In FIG. 3, a more detailed block diagram of interface device 90 is shown. The MR image from reconstruction unit (11 of FIG. 1) is provided to an iconizer 91. The iconizer scales the image down to a smaller image icon. This may be done by selecting every fifth pixel and using this to create an image icon one-fifth the size of the actual MR image. Any number of pixels may be skipped and icon size created keeping in mind that there is a tradeoff between the clarity in which the icon image is viewed and the amount of space it would require on the screen.

A control unit 93 receives the imaging parameters for the current image from the pulse sequencer 20, or optionally from a global transformation device 110 if employed. Control unit 93 then stores in a storage device 95, the icon and the corresponding imaging parameters which created the current image. Control unit 93 also provides the image icons and other icons used to control display of the image icons to a superposition device 97.

Superposition device 97 also receives the current MR image. Superposition device creates a composite image which is provided to display device 70, similar to that shown in FIG. 2.

Operator 5 actuates pointing device 100 which provides input to control unit 93 to scroll image icons back and forth, and to indicate selected screen icons such as the arrow icons 85, 87 or the "store location" icon 89. Scrolling is performed by selecting the image icons to be displayed, and adjusting the location in which each image icon is to be superimposed in the composite image. This information is passed from control unit 93 to superposition device 97. A presently preferred method of scrolling is to add image icons to one side of the display with one image icons being pushed off of the other side of the screen. For example, "store location" icon 89 is selected. A new image icon of the current MR image is created and displayed at the lower right of the screen. The image icons all move one place to the left with the leftmost image icon disappearing. This is repeated for all newly added image icons thereby causing a 'timeline' of image icon with the older icons being the leftmost icons.

Once an image icon is selected, control unit 93 reads the corresponding imaging parameters stored in storage 95 and provides them to pulse sequencer 20, and in the alternative to global transformation device 110, if employed. This causes a new MR image to be acquired and displayed on display device 70.

Figure 4:
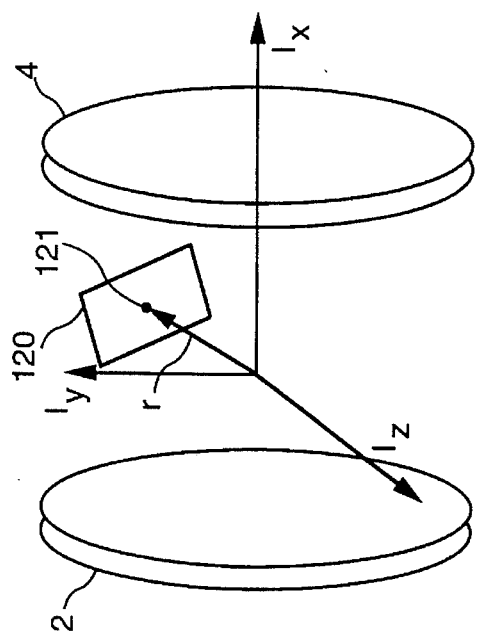
FIG. 4 illustrates a coordinate system fixed with respect to the MR scanner.

In FIG. 4, a global coordinate system, or imaging coordinate system is shown which is fixed with respect to the MR scanner. $I_x$ axis runs through the axis of the MR imaging magnets 2, 4. Imaging plane 120 is selected by defining a center point of the plane and three orientation angles defining a rotation about the $(I_x, I_y, I_z)$ axes. A displacement vector r indicates a displacement of center point 121 of imaging plane 120 with respect to the global coordinate system.

Operator 5 first determines a location of a center point 121 of imaging plane 120, an orientation and a field of view of imaging plane 120. These imaging parameters may be provided with respect to the coordinate system fixed with respect to the MR scanner. Optionally, the imaging parameters may be defined relative to a previously acquired image, and a global transformation device 110 may be employed which converts the input to global coordinates fixed with respect to the MR scanner.

FIG. 5 shows a conventional pulse sequence which excites an imaging plane oriented in the global coordinates $I_x$-$I_y$ plane with respect to the MR scanner. A 90° RF excitation pulse 151 is applied simultaneously with a first lobe of a slice selection pulse 153 in the $I_z$ direction. A second lobe of slice selection pulse 153 is applied simultaneously with a phase encoding pulse 157 in the $I_y$ direction. A 180° refocussing RF pulse 159 is then applied, followed by a first lobe of a readout pulse 161 in the $I_x$ direction. A second lobe of readout gradient 161 is applied and an MR signal 167 is acquired during time $T_s$ from the $I_x$-$I_y$ plane.

This pulse sequence may be modified to excite an imaging plane in an oblique direction. In the example of FIG. 6, an imaging plane oriented 45° with respect to the $I_x$ and $I_z$ axes is created by mixing gradient pulses along the $I_x$ and $I_z$ directions of FIG. 5 to result in gradient pulses 154 and 155 of FIG. 6. Also, readout gradient pulse 161 is used to construct readout pulses 163, 165. In FIG. 5, a slice select gradient pulse in the $I_x$ direction, and readout pulse in the $I_z$ direction are zero. With the other pulses being applied as described in FIG. 5, the pulse sequence of FIG. 6 causes a MR response signal 168 to be emitted by an imaging plane oriented at a 45° angle with respect to the $I_x$ and $I_z$ axes and be imaged. For a more detailed discussion of imaging plane orientation, please refer to U.S. Pat. No. 5,038,783, Aug. 13, 1991, C. L. Dumoulin, "Multiple gradient echo pulse sequence for acquisition of NMR Angiograms."

While several presently preferred embodiments of the present novel invention have been described in detail herein, many modifications and variations will now become apparent to those skilled in the art. It is our intent therefore, to be limited only by the scope of the appending claims and not by the specific details presented by way of illustration.

What we claim is:

1. A method of producing magnetic resonance (MR) images of a subject in an interactive fashion, comprising the steps of:

a) selecting imaging parameters comprising a location, orientation, and field of view of a plane of said subject in which an image is desired to be acquired;

b) acquiring an MR image of said subject at the selected imaging parameters;

c) displaying the acquired MR image on a display screen;

d) creating an image icon from the MR image;

e) storing the image icon along with the imaging parameters used to acquire the MR image;

f) repeating steps (a)–(e) for a plurality of MR images;

g) displaying at least one image icon on the display screen;

h) selecting one of the displayed image icons;

i) employing the stored imaging parameters corresponding to the selected image icon to acquire a new MR image.

2. The method of producing MR images of claim 1 further comprising the steps of:

a) displaying at least one scrolling arrow icon on the display screen;

b) selecting an arrow icon;

c) moving image icons in a direction indicated by the selected arrow icon.

3. An interactive magnetic resonance (MR) imaging system comprising:

a) an MR scanner acquiring MR images of a subject at an imaging plane defined by imaging parameters supplied to it;

b) a display screen displaying images and icons provided to it;

c) a pointing device interacting with an operator to select icons displayed on the display screen;

d) an interface means coupled to the MR scanner, the display screen, and the pointing device, creating an image icon from MR images provided by the MR scanner, storing the imaging parameters used to create each MR image corresponding to each image icon, displaying image icons on the display screen, for receiving input from the pointing device indicating an operator-selected image icon, supplying the stored imaging parameters corresponding to the selected image icon to the MR scanner, and causing the MR scanner to acquire a new MR image with the selected imaging parameters.

4. The interactive magnetic resonance (MR) imaging system of claim 3, wherein the interface means comprises:

a) an iconizer coupled to the MR scanner creating an image icon corresponding to an MR image provided to it;

b) a storage device storing imaging parameters and their corresponding image icons;

c) a superposition device coupled to the display device to display a composite image on the display device of images and icons provided to it;

d) a control unit coupled to the storage device, the iconizer, the MR scanner, and the pointing device, receiving the image icons and the corresponding imaging parameters from the iconizer and MR scanner, respectively, storing the image icons and corresponding imaging parameters in is the storage device, providing the image icons to the superposition device display, for receiving input from the pointing device indicating a selected image icon, providing the imaging parameters corresponding to the selected image icon to the MR scanner and causing the MR scanner to acquire a new MR image.

\* \* \* \* \*